(12) United States Patent
Bhattacharyya

(10) Patent No.: US 6,590,806 B1
(45) Date of Patent: Jul. 8, 2003

(54) MULTIBIT MAGNETIC MEMORY ELEMENT

(75) Inventor: Manoj K. Bhattacharyya, Cupertino, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/522,308

(22) Filed: Mar. 9, 2000

(51) Int. Cl.[7] ............................................... G11C 11/15
(52) U.S. Cl. ...................... 365/173; 257/421
(58) Field of Search ...................... 365/173; 257/421; 438/3

(56) References Cited

U.S. PATENT DOCUMENTS

| | | | | |
|---|---|---|---|---|
| 5,930,164 A | * | 7/1999 | Zhu | 365/158 |
| 5,936,293 A | * | 8/1999 | Parkin | 257/422 |
| 6,278,589 B1 | * | 8/2001 | Gill | 360/314 |

* cited by examiner

*Primary Examiner*—Douglas A. Wille

(57) ABSTRACT

A multibit magnetic memory cell includes first and second data layers. An antiferromagnetically coupled layer pair is disposed between the first and second data layers. In one embodiment the first and second data layers have distinct coercivities. The memory cell structure comprises a plurality of separation layers separating the first and second data layers and the antiferromagnetically coupled layer pair. In one embodiment, a coupling layer disposed between the antiferromagnetically coupled layer pair is a metallic conductive material comprising Ruthenium (Ru) or copper (Cu). In one embodiment, separation layers disposed between each of the first and second data layers and the antiferromagnetically coupled pair is nonconductive such that the cell is a spin dependent tunneling magnetoresistive (TMR) cell. Alternatively, the separation layers are conductive such that the cell is a giant magnetoresistive (GMR) cell. In various embodiments, a height of the first and second data layers is distinct. The height of a separation layer between the second data layer and one of the pair of reference layers is not the same as a height of a separation layer between the first data layer and the other one of the pair of reference layers in another embodiment.

20 Claims, 4 Drawing Sheets

| LAYER 410 | LAYER 470 | STACK RESISTANCE |
|---|---|---|
| → | → | R1+R2+dR2 |
| ← | → | R1+dR1+R2+dR2 |
| → | ← | R1+R2 |
| ← | ← | R1+dR1+R2 |

MULTIBIT MAGNETIC MEMORY ELEMENT

FIELD OF THE INVENTION

This invention relates to the field of nonvolatile memories. In particulars this invention is drawn to multiple bit magnetic memory cells.

BACKGROUND OF THE INVENTION

One type of nonvolatile memory relies on magnetoresistive principles. A particularly useful magnetoresistive effect is referred to as the giant magnetoresistive effect. In one embodiment, GMR-based magnetic memory cells are multilayered structured comprising conductive magnetic layers and a conductive non-magnetic metallic layer. The magnetic state of the cell is determined by the relative orientation of a magnetic vector in one magnetic layer to a magnetic vector in another magnetic layer (e.g., parallel or anti-parallel). The resistance of the cell differs according to the relative orientations of the magnetic vectors. Accordingly the state of the cell can be determined by applying a voltage across the cell and measuring a resulting sense current.

One type of GMR memory cell "pins" the magnetic vector of one of the layers. The layer containing the pinned magnetic vector is referred to as the reference layer. The state of the cell is then controlled by varying the orientation of the magnetic vector in the other magnetic layer. The non-pinned magnetic layer is also referred to as the data layer. The orientation of the magnetic vector in the data layer is controlled through the application of a magnetic field that has little effect on the magnetic vector of the pinned layer at least at low field intensities. This type of cell is referred to as a spin valve cell or as a GMR cell.

A spin dependent tunneling cell uses a non-conductive barrier layer such as dielectric material instead of a metallic layer between the reference and data layers. The transport mechanism between reference and data layers is tunneling through the barrier layer. Thus the cell may be referred to as a tunneling magnetoresistive (TMR) cell. The TMR cell offers a number of advantages over the conductive GMR cells. In particular, a greater change in resistance is observed with the TMR cell structure as opposed to the GMR cell structure.

With respect to both GMR and TMR cells structures, the reference or pinned layer can create a magnetostatic or demagnetization field in the data layer due to the proximity of the reference and data layers. The magnetostatic field from the reference layer can become the dominant field and thus permanently change the magnetization of the data layer. Data storage thus becomes unreliable. Although the height of the metallic separation layer can be increased to compensate for the magnetostatic field in the GMR cell structures, the height of the barrier in TMR structures is constrained by the necessity of having the barrier thin enough to accommodate quantum tunneling.

One prior art magnetic memory cell structure utilizes two data layers to store multiple bits. One disadvantage of this structure is that the length-to-width aspect ratio of each layer needs to be 5 or more to reduce the effect of the magnetostatic field thus reducing the storage density of a device constructed from such cells. Another disadvantage is that the prior art structure is capable of realizing only two resistance values. Determining the state of the device requires a destructive readback scheme followed by a rewrite operation.

SUMMARY OF THE INVENTION

In view of limitations of known systems and methods a magnetic memory cell structure and method of fabricating the structure are described.

One embodiment of a multibit magnetic memory cell includes first and second data layers. An antiferromagnetically coupled pair of reference layers is disposed between the first and second data layers. In one embodiment the first and second data layers have distinct coercivities. The memory cell structure comprises a separation layer separating each of the first and second data layers from the antiferromagnetically coupled layer pair. In one embodiment, the separation layers are nonconductive. In an alternative embodiment, the separation layers are conductive.

In various embodiments, heights and lengths of the layers may be selected to ameliorate magnetostatic fields between the data layers. In one embodiment, a height of the first and second data layers is not the same. In another embodiment, a height of the separation layer between the second data layer and the antiferromagnetically coupled pair of layers is not the same as a height of the separation layer between the first data layer and the antiferromagnetically coupled pair of reference layers.

A method of fabricating a multibit magnetic memory cell includes the step of forming a first ferromagnetic layer over a semiconductor substrate. The method includes the step of forming a second ferromagnetic layer over the first ferromagnetic layer. An antiferromagnetically coupled layer pair is formed such that the antiferromagnetically coupled layer pair is disposed between the first and second ferromagnetic layers.

Other features and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

The giant magnetoresistive (GMR) effect results from a change in resistance observed in a multilayer ferromagnetic/nonmagnetic structure when relative orientations of magnetic vectors in alternate magnetic layers changes as a function of an applied field. The resistance of the structure is a function of the angle between the magnetic vectors in adjacent magnetic layers. Magnetic vectors with the same orientation are referred to as "parallel." Magnetic vectors of opposite orientation are referred to as antiparallel.

The electrical resistivity of a magnetic metal depends on the direction of the electron spin to the magnetic vector of the layer. Electrons that have a parallel spin undergo less scattering resulting in a lower resistivity for the material. When the vectors of the magnetic layers are antiparallel at low field strengths, there are no electrons that have a low scattering rate in both magnetic layers. Thus the resistivity of the material increases. The electrical resisitivity of multilayered ferromagnetic/nonmagnetic structures thus depends on the relative orientations of the magnetic vectors of different magnetic layers.

Figure 1:
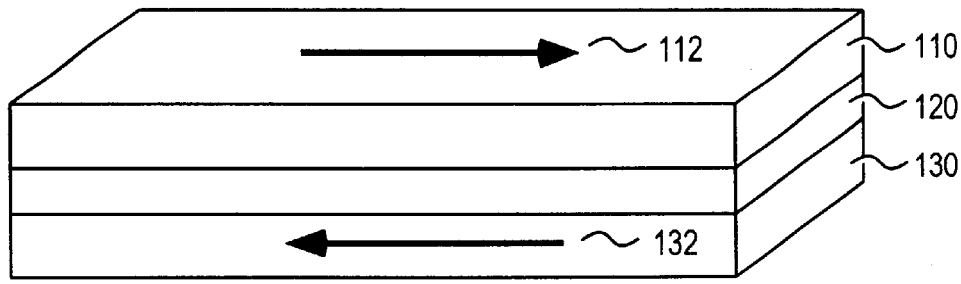
FIG. 1 illustrates one embodiment of a magnetic memory cell having a GMR cell structure.

FIG. 1 illustrates one embodiment of a magnetic memory cell 100 having a nonmagnetic separation layer 120 sandwiched between two magnetic layers 110 and 130. Each of the magnetic layers has a magnetic vector 112 and 132. The illustrated magnetic vectors 112 and 132 are anti-parallel. The magnetic layers 110 and 130 are conductive metallic layers. In one type of magnetic memory cell (i.e., GMR), separation layer 120 is a conductive metallic layer.

Figure 2:
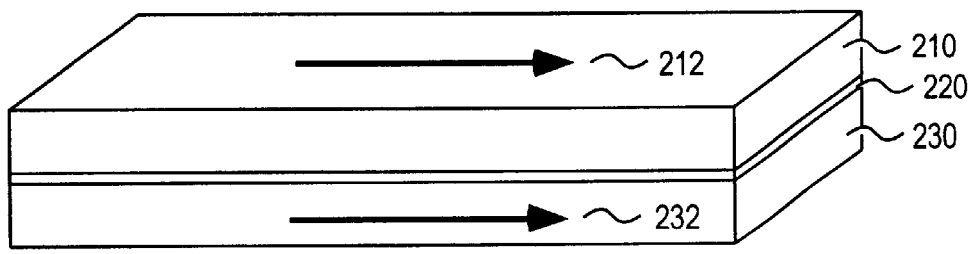
FIG. 2 illustrates one embodiment of a TMR cell structure.

FIG. 2 illustrates another embodiment of a magnetic memory cell 200. Cell 200 includes two magnetic layers 210 and 230 separated by a dielectric or nonconductive separation layer 220. Magnetic vectors 212 and 232 are parallel in this example. Current flow is accomplished by quantum tunneling between magnetic layers 210 and 230 through separation layer 220. This type of cell is a spin dependent tunneling magnetoresistive (TMR) cell.

Magnetic memory cells can be constructed such that the magnetic vector in one of the layers is "pinned" to prevent changes. Such cells are referred to as spin valve cells. Referring to FIGS. 1 and 2, if layers 130 and 230 are pinned, then layers 110 and 210 are referred to as the data layers and layers 130 and 230 are referred to as the reference layers. The state of the cell is determined by the relative orientation of the magnetic vectors between the data and reference layers. Given that the reference layer has a fixed magnetic vector 232, cell 200 is capable of representing 2 states corresponding to a single bit of information. Magnetic memory cells can also be designed to store multiple bits of information.

Figure 3:
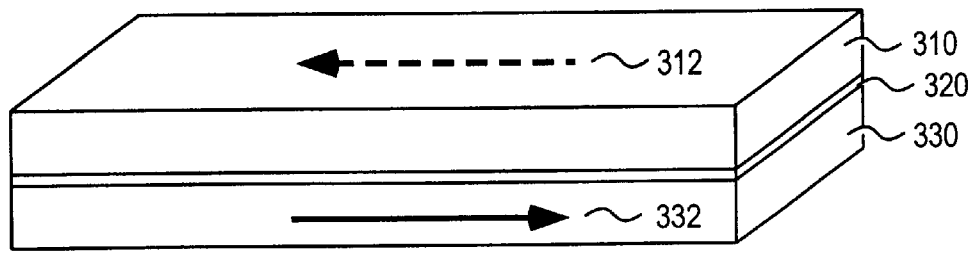
FIG. 3 illustrates the magnetic vector of a data layer antiparallel to a magnetic vector in the reference layer as a result of the magnetostatic field generated by the reference layer.

As the distance between the magnetic layers decreases, the effect of the magnetic vector of the reference layer upon the data layer becomes more pronounced. Referring to FIG. 3, reference layer 330 imposes an magnetostatic field on the data layer 310. The magnetostatic field induces an antiparallel magnetic vector in data layer 310 relative to reference layer 330 as indicated by vectors 312 and 332. As the dimensions of the intervening separation layer 320 decreases, the magnetostatic field of the reference layer 330 may permanently change the magnetization of the data layer 310 rendering the memory cell incapable of reliable data storage. For non-tunneling devices or GMR devices, this undesirable effect can be ameliorated somewhat by increasing the height of the metallic separation layer 120. For tunneling structures, however, the height of separation layer 220 is constrained by the need to support quantum tunneling.

Figures 4, 5:
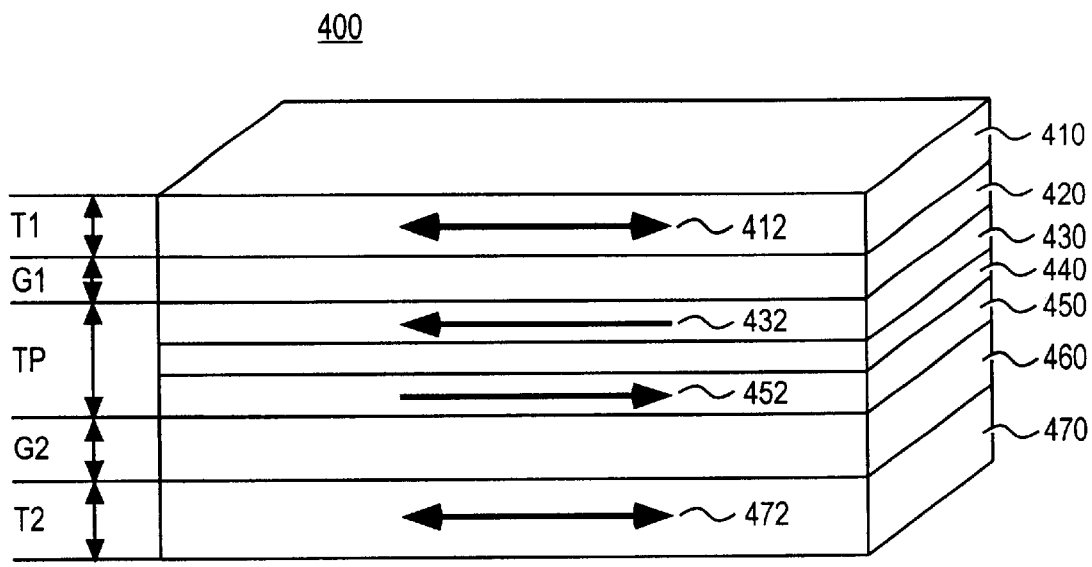
FIG. 4 illustrates one embodiment of a multiple bit magnetic memory cell structure.
FIG. 5 illustrates a table of resistance values corresponding to the relative orientation of the magnetic vectors in the data layers of FIG. 4.

FIG. 4 illustrates one embodiment of a multiple bit magnetic memory cell 400. Cell 400 includes a pair of reference layers 430, 450 and two data layers 410, 470. Layers 430 and 150 are separated by a thin separation layer 440. The height and composition of layer 440 are selected to result in permanent antiferromagnetic coupling between layers 430 and 450. In one embodiment, the thickness of separation layer 440 is between 0.5 and 1.0 nm. In various embodiments, layer 440 comprises Ruthenium (Ru) or copper (Cu).

A first data layer 410 is separated from reference layer 430 by a first separation layer 420. Similarly, a second data layer 470 is separated from reference layer 450 by a second separation layer 460. In one embodiment, separation layers 420 and 460 are nonconductive, nonmetallic layers such that cell 400 is a TMR cell. In an alternative embodiment, layers 420 and 460 are conductive metallic layers such that cell 400 is a GMR cell.

The antiferromagnetically coupled pair of layers (430, 450) set up opposing magnetostatic fields. Due to the relative proximity of these layers to each other with respect to the proximity of the pair to each data layer, however, the opposing magnetic fields substantially cancel each other. Thus the opposing magnetostatic fields produced by antiparallel magnetic vectors in layers 430 and 450 do not have an appreciable net effect on data layer 410 or data layer 470. Moreover, the height of the individual layers within the cell can be selected to decrease the effect of magnetostatic fields from the data layers on each other.

The use of two data layers permits cell 400 to store two bits of information. Thus cell 400 is a multiple bit or multibit memory cell. In one embodiment, the data layers 410 and 470 have different coercivities. This may be accomplished, for example, by constructing layers 410 and 470 from different materials. The height or thickness of data layer 410 is T1. The height or thickness of data layer 470 is T2. In one embodiment, data layers 410 and 470 have different thicknesses such that T1≠T2.

The resistance between layer 410 and 430 is R1 when magnetic vectors 412 and 432 are parallel. The resistance increases by an amount, dR1, when magnetic vectors 412 and 432 are anti-parallel. In one embodiment, R1 is approximately 1 MΩ and dR1 is approximately 200 KΩ.

The resistance between layers 450 and 470 is R2 when magnetic vectors 452 and 472 are parallel. The resistance increases by an amount, dR2, when magnetic vectors 452 and 472 are anti-parallel. In one embodiment, R2 is approximately 2 MΩ and dR2 is approximately 400 KΩ.

Table 500 of FIG. 5 illustrates the relationship between the orientation of the magnetic vectors 412 and 470 and the stack resistance across cell 400 expressed as functions of R1, R2, dR1, and dR2. The resistance is being measured between the first 410 and second 470 data layers without regard to reference layers 430 and 450. The antiferromagnetically coupled pair of reference layers, however, are referred to as reference layers in this case because of the permanent orientation of their magnetic vectors 432 and 452.

Memory cell 400 can realize four distinct values of stack resistance when dR1≠dR2. This may be accomplished by varying the material or the height of separation layers 420 and 460. This is accomplished in one embodiment, for example, by selecting the dimensions of layers 420 (G1) and 460 (G2) such that G1 is substantially different from G1 (i.e., G1≠G2). The ability to represent each state by a unique resistance instead of by a resistance/vector combination enables the elimination of a destructive read process.

Figure 6:
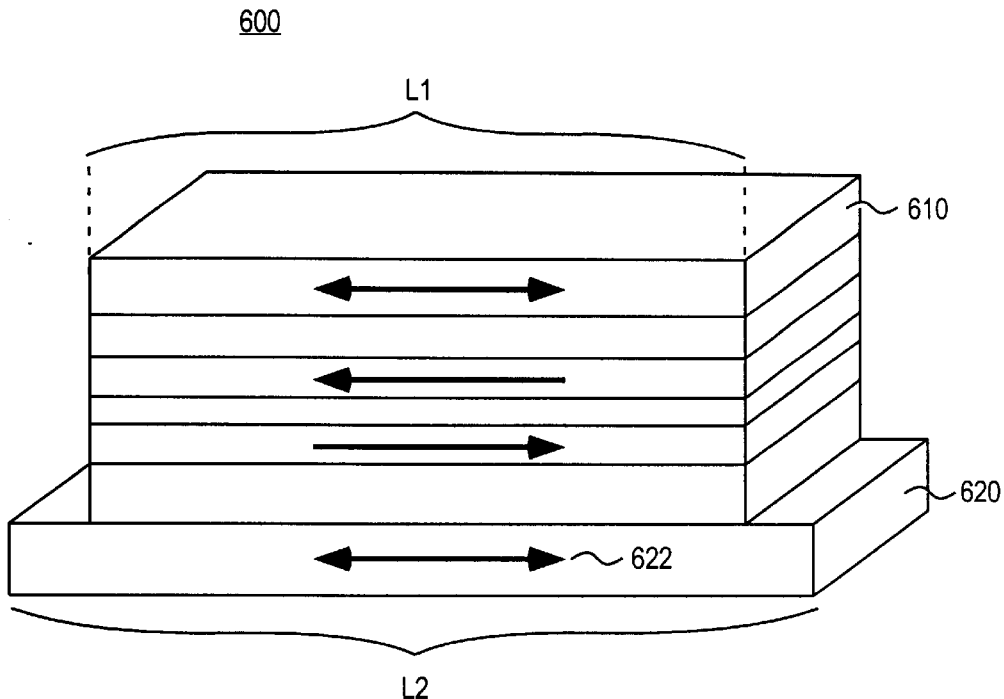
FIG. 6 illustrates one embodiment of a magnetic memory cell structure with data layers of varying lengths.

With dimensions of T2≈4 nm, G2≈2.5 nm, TP≈9 nm, G1≈1.5 nm, and T1≈2 nm, the center of data layer 410 is 16 nm away from the center of data layer 470. At this distance, the effect of the magnetostatic field of data layer 470 on data layer 410 is significantly reduced. The effect can be further reduced by increasing the length of the thicker data layer relative to that of the thinner data layer as illustrated in FIG. 6. The effect of the magnetostatic field from the thicker data layer 620 on the thinner data layer 610 of memory cell 600 can be reduced by increasing the length (L2) of the thicker data layer 620 relative to that (L1) of the thinner data layer 610.

Figure 7:
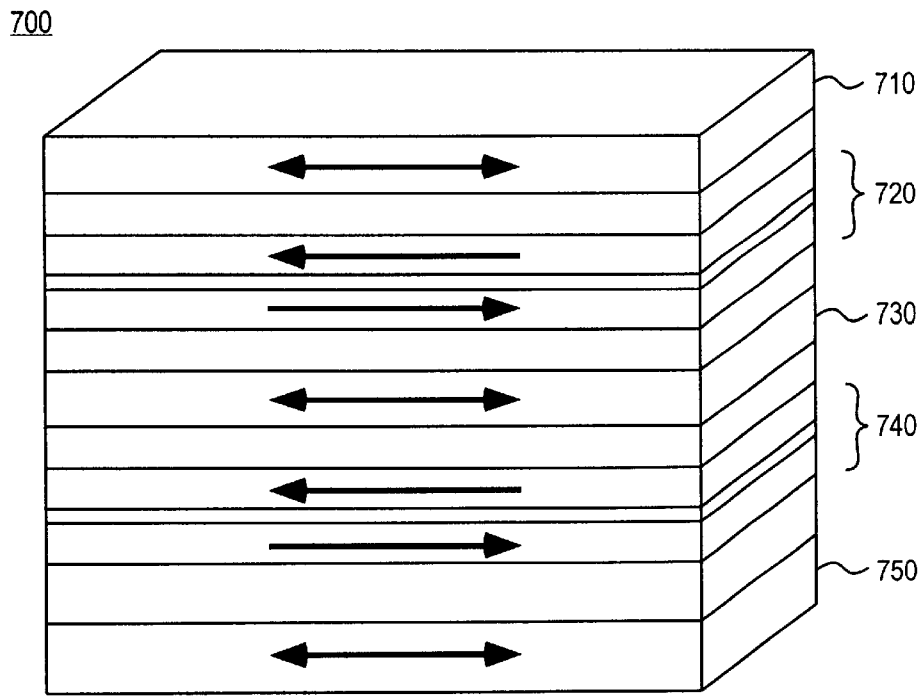
FIG. 7 illustrates one embodiment of a 3 bit magnetic memory cell structure.

The cell structure can be expanded to store more than two bits as illustrated in cell 700 of FIG. 7. Cell 700 includes a first data layer 710, a second data layer 730, and a third data layer 750. A first antiferromagnetically coupled layer pair 720 is disposed between the first 710 and second 730 data layers. A second antiferromagnetically coupled pair of layers 740 is disposed between the second 730 and third 750 data layers. Up to eight magnetic vector combinations are possible with cell 700. Through proper selection of layer materials, the stack resistance corresponding to each state can be distinct. Thus cell 700 can represent up to 3 bits of information through eight different resistance values. The cell structure can be further expanded to support higher storage densities if needed.

A plurality of magnetic memory cells may be arranged to form a magnetic random access memory (MRAM) storage device. The cells are individually referred to as MRAM cells. In one embodiment, the MRAM device comprises an array of MRAM cells individually accessed by a sense line and a word line arranged in a mesh or grid of electrical conductors. In one embodiment, the array of MRAM cells is formed on a semiconductor substrate so that the MRAM storage device can have the form factor of an integrated circuit package.

Figure 8:
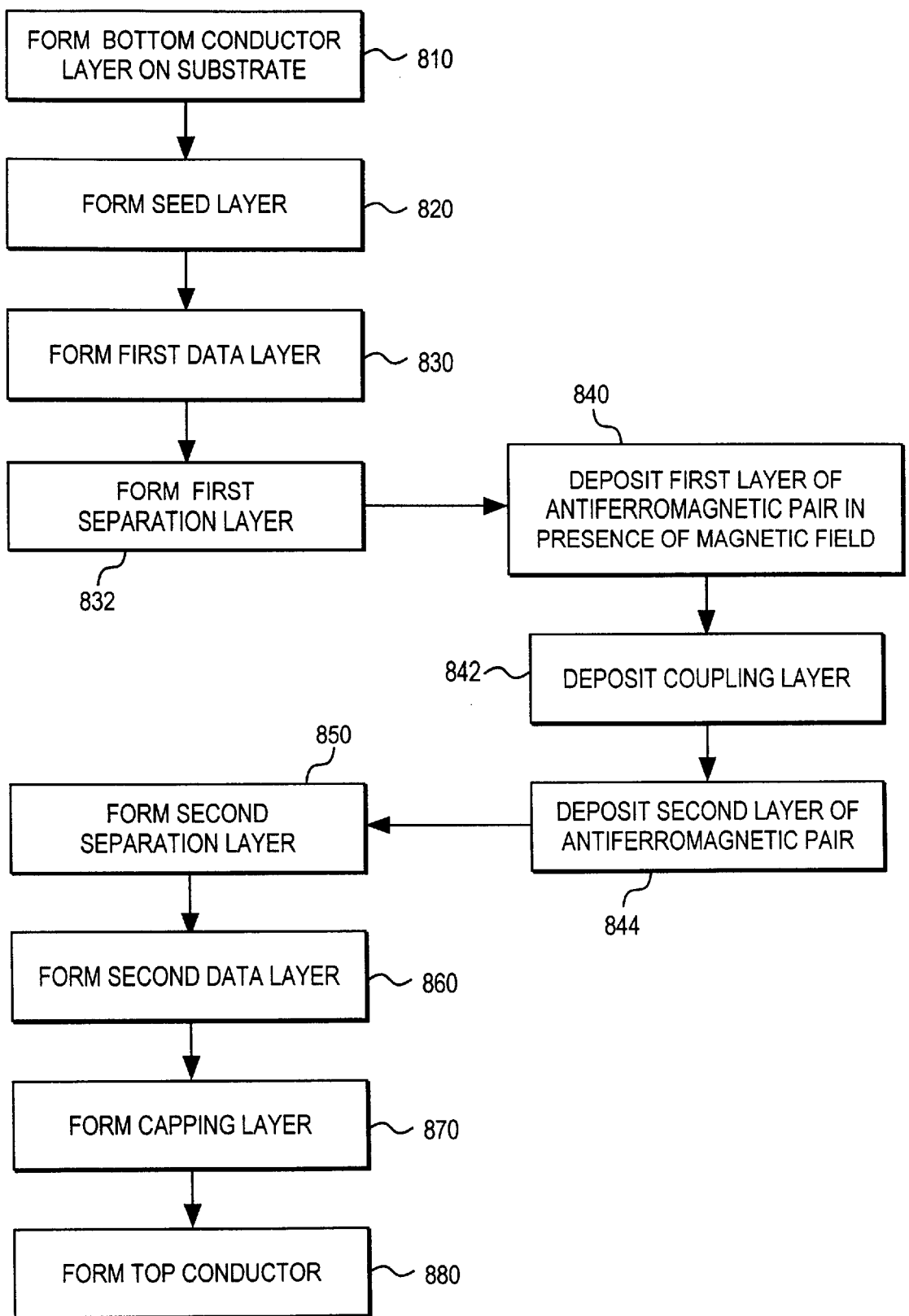
FIG. 8 illustrates one embodiment of a method of forming a multibit magnetic memory cell having an antiferromagnetically coupled layer pair disposed between two data layers.

FIG. 8 illustrates a method of forming individual multibit magnetic memory cells on a semiconductor substrate. In step 810 a conductor layer is formed on the semiconductor substrate. In step 820 a seeding layer is formed over the conductor layer. A first data layer is formed over the seeding layer in step 830. A first separation layer is then formed over the first data layer in step 832.

In step 840, a first layer of the antiferromagnetic pair is deposited over the first separation layer in the presence of an external magnetic field. An antiferromagnetic pair coupling layer is formed over the first layer of the antiferromagnetic pair in step 842. A second layer of the antiferromagnetic pair is deposited over the antiferromagnetic pair coupling layer in step 844.

In one embodiment, the material selected for the antiferromagnetically coupled layers has high anisotrpy (Hk). In one embodiment, the material for the antiferromagnetically coupled pair of layers comprises cobalt (Co). In various embodiments, the coupling layer comprises Ruthenium or copper. The antiferromagnetic coupling field of the coupling layer pins the magnetic vector of the second layer. In one embodiment the coupling layer is less than 1 nm thick.

In step 850, a second separation layer is formed over the second layer of the antiferromagnetically coupled pair of layers. In one embodiment, each of the first and second separation layers is formed by depositing an aluminum (Al) layer which is then oxidized in an argon/oxygen (Ar/O$_2$) plasma to form an aluminum oxide tunnel barrier. In one embodiment, the separation layers comprise metallic conductive material.

In step 860, the second data layer is formed over the second separation layer. The first and second data layers may be formed by sputtering or evaporating ferromagnetic material. In one embodiment, each of the first and second data layers comprises a nickel-iron (NiFe) or a nickel-iron-cobalt (NiFeCo) alloy.

A capping layer may be applied to the magnetic memory cell stack as indicated in step 870. A top conductor is formed over the stack in step 880 such that the cell is sandwiched between the top and bottom conductors.

In the preceding detailed description, the invention is described with reference to specific exemplary embodiments thereof. Various modifications and changes may be made thereto without departing from the broader spirit and scope of the invention as set forth in the claims. The specification and drawings are, accordingly, to be regarded in an illustrative rather than a restrictive sense.

What is claimed is:

1. A memory cell apparatus comprising:
    a first and a second data layer comprising magnetic material;
    a first and a second nonconductive separation layer; and
    an antiferromagnetically coupled reference layer pair disposed between the first and second data layers, wherein each data layer is separated from the antiferromagnetically coupled reference layer pair by one of the separation layers.

2. The apparatus of claim 1 wherein the first separation layer has a height G1, wherein the second separation layer has a height G2, wherein G1≠G2.

3. The apparatus of claim 1 wherein each separation layer is a barrier comprising a nonconductive nonmagnetic material.

4. The apparatus of claim 1 wherein each separation layer comprises a nonconductive nonmetallic material.

5. The apparatus of claim 1 wherein the first and second data layers have different coercivities.

6. The apparatus of claim 1 wherein a height T1 of the first data layer is substantially distinct from a height T2 of the second data layer such that T1≠T2.

7. The apparatus of claim 6 wherein T2>T1 wherein a length of the second data layer is greater than a length of the first data layer.

8. The apparatus of claim 1 wherein the antiferromagnetically coupled layer pair are separated by a conductive coupling layer.

9. An apparatus comprising:
    a plurality of magnetic memory cells formed on a semiconductor substrate, wherein each cell comprises:
    first and second ferromagnetic data layers;
    a pair of antiferromagnetically coupled layers disposed between the first and second data layers; and
    first and second nonconductive separation layers, each data layer separated from the pair of antiferromagnetically coupled layers by one of the separation layers.

10. The apparatus of claim 9 wherein the first separation layer has a height G1, wherein the second separation layer has a height G2, wherein G1≠G2.

11. The apparatus of claim 9 wherein each separation layer comprises a nonmagnetic material.

12. The apparatus of claim 9 wherein each separation layer comprises a nonmetallic material.

13. The apparatus of claim 9 wherein the first and second data layers have different coercivities.

14. The apparatus of claim 9 wherein a height T1 of the first data layer is substantially distinct from a height T2 of the second data layer such that T1≠T2.

15. The apparatus of claim 14 wherein a length L1 of the first data layer is less than a length L2 of the second data layer such that L1<L2.

16. The apparatus of claim 9 wherein the antiferromagnetically coupled pair of layers are separated by a conductive coupling layer.

17. A memory cell apparatus comprising:
   a first data layer;
   a first reference layer;
   a first nonconductive separation layer disposed between the first data layer and the first reference layer;
   a second reference layer antiferromagnetically coupled to the first reference layer;
   a second data layer, wherein the reference layers are disposed between the first and second data layers; and
   a second nonconductive separation layer disposed between the second data layer and the second reference layer.

18. The apparatus of claim 17 wherein at least one separation layer comprises nonmetallic material.

19. The apparatus of claim 17 wherein at least one separation layer comprises nonmagnetic material.

20. The apparatus of claim 17 wherein the data layers are substantially distinct in at least one of the following properties: coercivity, height, and length.

* * * * *